(12) United States Patent
Takahashi et al.

(10) Patent No.: US 11,919,048 B2
(45) Date of Patent: Mar. 5, 2024

(54) METHOD OF CLEANING AN OPTICAL FILM-THICKNESS MEASURING SYSTEM

(71) Applicant: EBARA CORPORATION, Tokyo (JP)

(72) Inventors: Nobuyuki Takahashi, Tokyo (JP); Toru Maruyama, Tokyo (JP); Taichi Yokoyama, Tokyo (JP); Zhongxin Wen, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 176 days.

(21) Appl. No.: 17/416,757

(22) PCT Filed: Dec. 16, 2019

(86) PCT No.: PCT/JP2019/049154
§ 371 (c)(1),
(2) Date: Jun. 21, 2021

(87) PCT Pub. No.: WO2020/137653
PCT Pub. Date: Jul. 2, 2020

(65) Prior Publication Data
US 2022/0072590 A1    Mar. 10, 2022

(30) Foreign Application Priority Data
Dec. 26, 2018 (JP) .................................. 2018-243086

(51) Int. Cl.
*B08B 3/04* (2006.01)
*B08B 3/02* (2006.01)
(Continued)

(52) U.S. Cl.
CPC ............... *B08B 3/04* (2013.01); *B08B 3/022* (2013.01); *B24B 37/013* (2013.01); *B24B 37/34* (2013.01); *B08B 2203/027* (2013.01)

(58) Field of Classification Search
CPC ..... B08B 3/04; B08B 3/022; B08B 2203/027; B24B 37/013; B24B 37/34
See application file for complete search history.

(56) References Cited

U.S. PATENT DOCUMENTS

| 6,599,765 B1 * | 7/2003 | Boyd ..................... B24B 37/205 |
| | | 451/6 |
| 2001/0005265 A1 * | 6/2001 | Kimba ..................... B08B 1/04 |
| | | 250/559.27 |

(Continued)

FOREIGN PATENT DOCUMENTS

| CN | 1537324 A | 10/2004 |
| CN | 1791490 A | 6/2006 |

(Continued)

OTHER PUBLICATIONS

International Patent Application No. PCT/JP2019/049154; Int'l Search Report; dated Mar. 10, 2020; 4 pages.

(Continued)

*Primary Examiner* — Sharidan Carrillo
(74) *Attorney, Agent, or Firm* — BakerHostetler

(57) ABSTRACT

The present invention relates to a method of cleaning an optical film-thickness measuring system used for measuring a film thickness of a substrate, such as a wafer, while polishing the substrate. The method includes: cleaning an optical sensor head (7) by supplying a rinsing liquid into a through-hole (51) formed in a polishing pad (2) on a polishing table (3) before or after polishing of a substrate (W) with use of slurry, the optical sensor head (7) being located below the through-hole (51); and discharging the rinsing liquid from the through-hole (51) through a drain line (54).

11 Claims, 12 Drawing Sheets

(51) Int. Cl.
*B24B 37/013* (2012.01)
*B24B 37/34* (2012.01)

(56) References Cited

U.S. PATENT DOCUMENTS

| | | | |
|---|---|---|---|
| 2003/0205325 A1* | 11/2003 | Boyd | B24B 49/12 |
| | | | 156/345.12 |
| 2004/0235301 A1 | 11/2004 | Wada et al. | |
| 2004/0242121 A1 | 12/2004 | Hirokawa et al. | |
| 2005/0225967 A1 | 10/2005 | Antonis | |
| 2007/0173177 A1 | 7/2007 | Hirokawa et al. | |
| 2013/0273814 A1* | 10/2013 | Kobayashi | B24B 37/013 |
| | | | 451/6 |
| 2013/0344773 A1* | 12/2013 | Hiroo | B24B 49/12 |
| | | | 451/41 |
| 2015/0017887 A1 | 1/2015 | Kobayashi et al. | |
| 2015/0111314 A1 | 4/2015 | Iizumi et al. | |

FOREIGN PATENT DOCUMENTS

| | | |
|---|---|---|
| CN | 108818295 A | 11/2018 |
| JP | H11-204472 A | 7/1999 |
| JP | 2001-088021 A | 4/2001 |
| JP | 2001-235311 A | 8/2001 |
| JP | 2005-057100 A | 3/2005 |
| JP | 2005-526292 A | 9/2005 |
| JP | 2006-525878 A | 11/2006 |
| JP | 6195754 B2 | 9/2017 |
| JP | 2018-075650 A | 5/2018 |
| KR | 2001-0002643 A | 1/2001 |
| WO | WO-2020137653 A1 * 7/2020 ............... B08B 3/02 |

OTHER PUBLICATIONS

Singapore Patent Application No. 11202106510R; Search Report; dated Sep. 20, 2022; 2 pages.

* cited by examiner

--Prior Art--

METHOD OF CLEANING AN OPTICAL FILM-THICKNESS MEASURING SYSTEM

TECHNICAL FIELD

The present invention relates to a method of cleaning an optical film-thickness measuring system used for measuring a film thickness of a substrate, such as a wafer, while polishing the substrate.

BACKGROUND ART

Processes of manufacturing semiconductor devices include various steps such as a step of polishing a dielectric film (e.g., $SiO_2$) and a step of polishing a metal film (e.g., copper or tungsten). Wafer polishing is performed using a polishing apparatus. The polishing apparatus generally includes a polishing table that supports a polishing pad, a polishing head configured to press a wafer against the polishing pad, and a slurry supply nozzle configured to supply slurry onto the polishing pad. While the polishing table is rotating, the slurry is supplied onto the polishing pad on the polishing table, and the polishing head presses the wafer against the polishing pad. The wafer is placed in sliding contact with the polishing pad in the presence of slurry. The surface of the wafer is planarized by a combination of a chemical action of the slurry and a mechanical action of abrasive grains contained in the slurry.

Polishing of the wafer is terminated when a thickness of a film (e.g., a dielectric film, a metal film, a silicon layer, etc.) constituting the surface of the wafer reaches a predetermined target value. The polishing apparatus generally includes an optical film-thickness measuring system for measuring a thickness of a non-metal film, such as a dielectric film or a silicon layer. This optical film-thickness measuring system is configured to transmit light, emitted by a light source, to the surface of the wafer, measure intensity of reflected light from the wafer with a spectrometer, and analyze a spectrum of the reflected light to determine the film thickness of the wafer. (see, for example, patent document 1).

FIG. 12 is a schematic view of an optical film-thickness measuring system. A light source 500 and a spectrometer 501 are coupled to an optical sensor head 510. The optical sensor head 510 is arranged in a polishing table 515. A through-hole 521 is formed in a polishing pad 520, and the optical sensor head 510 is located below the through-hole 521. The light emitted by the light source 500 is transmitted to the optical sensor head 510, and the optical sensor head 510 irradiates a wafer W with the light that has passed through the through-hole 521. The reflected light from the wafer W passes through the through-hole 521 and is received by the optical sensor head 510.

During the polishing of the wafer W, the slurry is supplied onto the polishing pad 520. The slurry flows into the through-hole 521 and as a result, the slurry can hinder traveling of the light. Therefore, in order to ensure a light path, pure water is supplied from a pure-water supply line 530 to the through-hole 521 of the polishing pad 520. The through-hole 521 is filled with the pure water, so that the slurry and polishing debris that have entered the through-hole 521 are discharged together with the pure water through a drain line 540. The flow of pure water formed in the through-hole 521 ensures the light path and enables highly accurate measuring of the film thickness.

CITATION LIST

Patent Literature

Patent document 1: Japanese laid-open patent publication No. 2001-235311

SUMMARY OF INVENTION

Technical Problem

However, the drain line 540 may be clogged with the slurry and/or the polishing debris. In such a case, the pure water cannot be discharged from the through-hole 521 and overflows onto the polishing pad 520 and dilutes the slurry on the polishing pad 520. The dilution of the slurry can cause a polishing failure of the wafer W. In addition, the slurry and/or the polishing debris remain in the through-hole 521 and may adhere to the optical sensor head 510. As a result, the overall intensity of the reflected light sent to the spectrometer 501 is lowered, and the accurate measuring of the film thickness is prevented.

Therefore, the present invention provides a method capable of allowing an optical film-thickness measuring system to function properly by cleaning an optical sensor head used in the optical film-thickness measuring system.

Solution to Problem

In an embodiment, there is provided a method comprising: cleaning an optical sensor head by supplying a rinsing liquid into a through-hole formed in a polishing pad on a polishing table before or after polishing of a substrate with use of slurry is performed, the optical sensor head being located below the through-hole; and discharging the rinsing liquid from the through-hole through a drain line.

In an embodiment, the rinsing liquid is supplied into the through-hole while the through-hole is covered with a structural element.

In an embodiment, the rinsing liquid is supplied into the through-hole while the through-hole is covered with the structural element and the polishing table is stationary.

In an embodiment, the rinsing liquid is supplied into the through-hole while the through-hole is intermittently covered with the structural element and the polishing table is rotating.

In an embodiment, the structural element is a wafer.

In an embodiment, the rinsing liquid is supplied into the through-hole through a liquid supply line extending in the polishing table.

In an embodiment, the rinsing liquid is supplied into the through-hole from a polishing-pad cleaning nozzle arranged above the polishing pad.

In an embodiment, supplying of the rinsing liquid into the through-hole comprises emitting the rinsing liquid toward a lower surface of a polishing-pad cleaning nozzle arranged above the polishing pad, and supplying the rinsing liquid that has fallen from the lower surface of the polishing-pad cleaning nozzle into the through-hole.

In an embodiment, the drain line is coupled to a drain pump configured to suck the rinsing liquid from the through-hole.

Advantageous Effects of Invention

According to the present invention, when the polishing operation with use of the slurry is not performed, the rinsing liquid is supplied into the through-hole, and the rinsing liquid flows through the drain line. As a result, the optical sensor head and the drain line are cleaned with the rinsing liquid, so that the optical film-thickness measuring system can maintain its proper operations.

DESCRIPTION OF EMBODIMENTS

Figure 1:
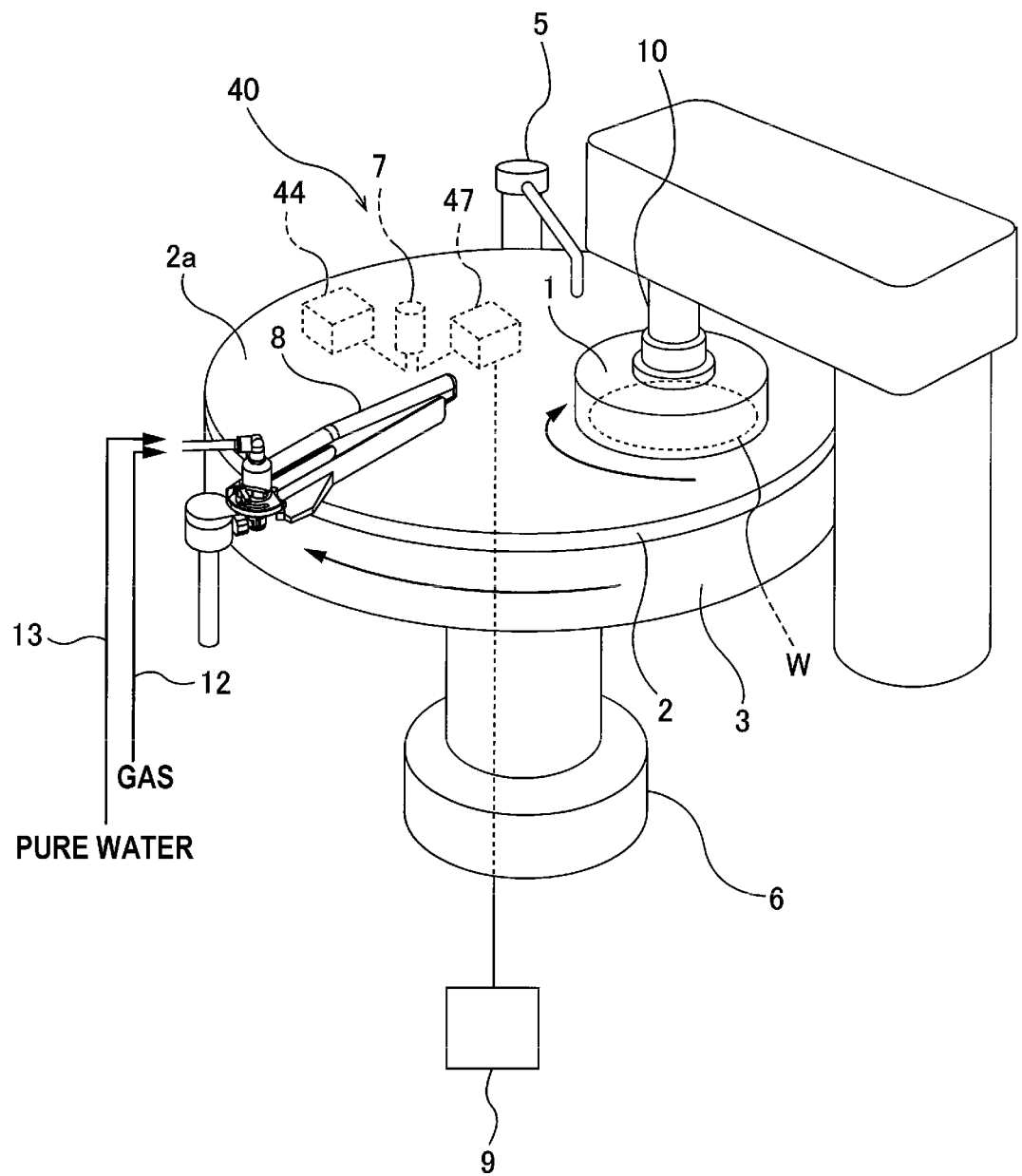
FIG. 1 is a schematic view showing a polishing apparatus capable of performing an embodiment of a polishing method.

Hereinafter, embodiments of the present invention will be described. FIG. 1 is a schematic view showing a polishing apparatus capable of performing an embodiment of a polishing method. As shown in FIG. 1, the polishing apparatus includes a polishing table 3 that supports a polishing pad 2, a polishing head 1 configured to press a wafer W, which is an example of a substrate, against the polishing pad 2, a table motor 6 configured to rotate the polishing table 3, a liquid supply nozzle 5 configured to supply slurry onto the polishing pad 2, and an atomizer 8 as a polishing-pad cleaning nozzle configured to clean a polishing surface 2a of the polishing pad 2.

The polishing head 1 is coupled to a head shaft 10, and the polishing head 1 rotates together with the head shaft 10 in a direction indicated by arrow. The polishing table 3 is coupled to the table motor 6, and the table motor 6 is configured to rotate the polishing table 3 and the polishing pad 2 in a direction indicated by arrow.

The atomizer 8 is arranged above the polishing pad 2. The atomizer 8 is coupled to a gas supply line 12 for delivering a gas, such as an inert gas, and a pure-water supply line 13 for delivering pure water. The gas and the pure water are supplied to the atomizer 8 through the gas supply line 12 and the pure-water supply line 13 to form a fluid mixture composed of the gas and the pure water. The atomizer 8 supplies the fluid mixture to the polishing surface 2a of the polishing pad 2 after polishing of the wafer W so as to clean the polishing surface 2a.

The polishing apparatus includes an optical film-thickness measuring system 40 for measuring a film thickness of the wafer W. The optical film-thickness measuring system 40 includes an optical sensor head 7, a light source 44, a spectrometer 47, and a data processor 9. The optical sensor head 7, the light source 44, and the spectrometer 47 are mounted to the polishing table 3, and rotate together with the polishing table 3 and the polishing pad 2. The position of the optical sensor head 7 is such that the optical sensor head 7 moves across the surface of the wafer W on the polishing pad 2 each time the polishing table 3 and the polishing pad 2 make one rotation. The optical sensor head 7 is coupled to the light source 44 and the spectrometer 47. The spectrometer 47 is coupled to the data processor 9.

The light source 44 transmits light to the optical sensor head 7, and the optical sensor head 7 emits the light toward the wafer W. The reflected light from the wafer W is received by the optical sensor head 7 and transmitted to the spectrometer 47. The spectrometer 47 decomposes the reflected light according to wavelength and measures the intensity of the reflected light at each of the wavelengths of the reflected light. The spectrometer 47 sends a measurement data of the intensity of the reflected light to the data processor 9. The data processor 9 generates a spectrum of the reflected light from the measurement data of the intensity of the reflected light. This spectrum shows a relationship between the intensity and the wavelength of the reflected light, and the shape of the spectrum changes according to the film thickness of the wafer W. The data processor 9 determines the film thickness of the wafer W from the optical information contained in the spectrum.

The wafer W is polished as follows. While the polishing table 3 and the polishing head 1 are rotated in the directions indicated by the arrows in FIG. 1, the slurry is supplied from the liquid supply nozzle 5 to the polishing surface 2a of the polishing pad 2 on the polishing table 3. While the wafer W is being rotated by the polishing head 1, the wafer W is pressed by the polishing head 1 against the polishing surface 2a of the polishing pad 2 in the presence of the slurry on the polishing pad 2. The surface of the wafer W is polished by the chemical action of the slurry and the mechanical action of abrasive grains contained in the slurry.

During polishing of the wafer W, the optical sensor head 7 directs the light to multiple measurement points on the wafer W and receives the reflected light from the wafer W while sweeping across the surface of the wafer W on the polishing pad 2 each time the polishing table 3 makes one rotation. The data processor 9 determines the film thickness of the wafer W from the measurement data of the intensity of the reflected light, and controls operations of polishing of the wafer W based on the film thickness. For example, the data processor 9 may determine a polishing end point at which the film thickness of the wafer W reaches a target film thickness.

After the polishing of the wafer W is terminated, the wafer W is separated from the polishing pad 2 and conveyed to a next process. Thereafter, the polishing surface 2a of the polishing pad 2 is cleaned by the atomizer 8. Specifically, the atomizer 8 supplies the fluid mixture of gas and pure water to the polishing surface 2a of the polishing pad 2 while the polishing pad 2 and the polishing table 3 are rotating. The fluid mixture removes the slurry and polishing debris from the polishing surface 2a.

Figure 2:
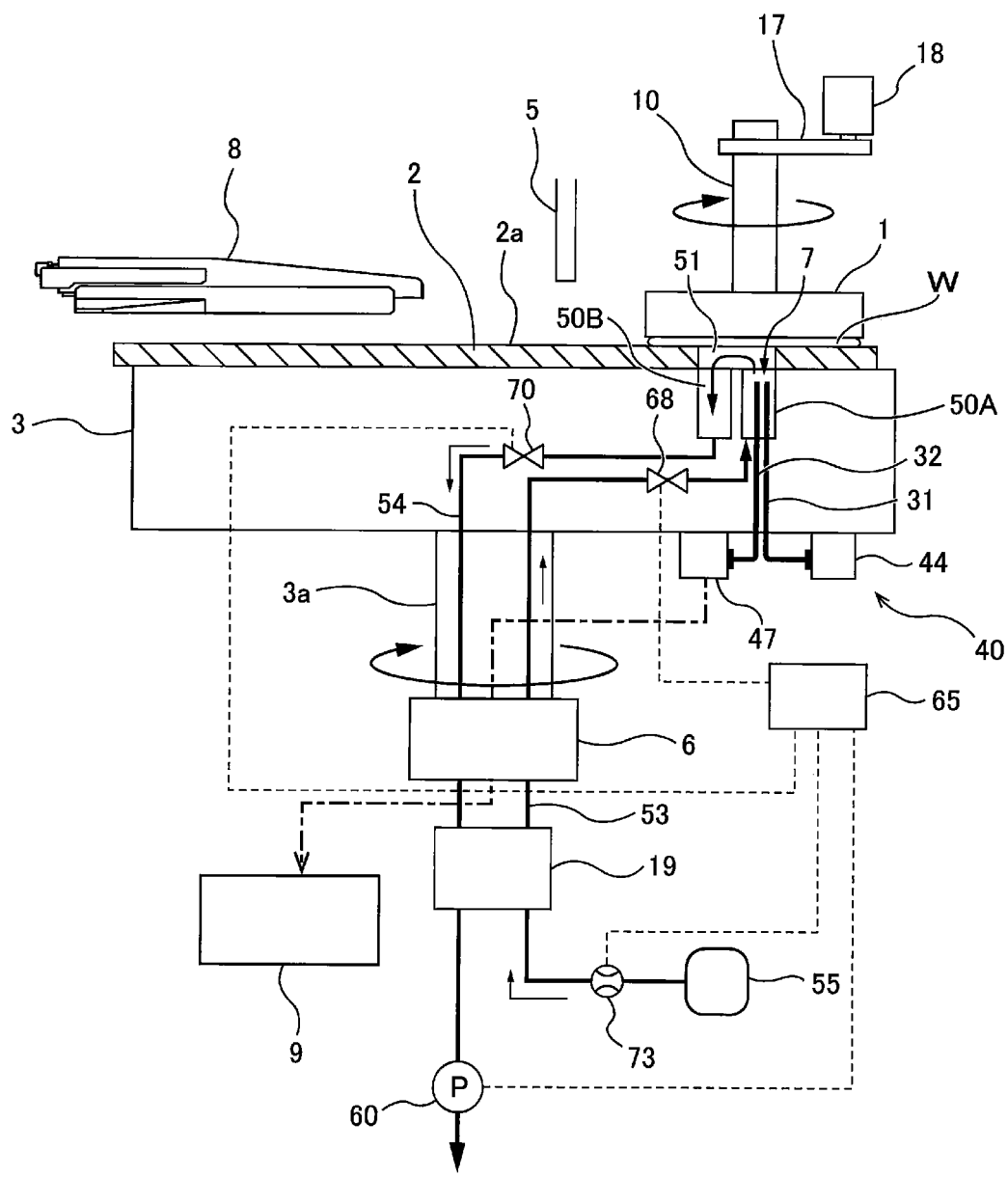
FIG. 2 is a cross-sectional view showing an embodiment of detailed configurations of the polishing apparatus shown in FIG. 1.

FIG. 2 is a cross-sectional view showing an embodiment of detailed configurations of the polishing apparatus shown in FIG. 1. The head shaft 10 is coupled to a polishing head motor 18 via a coupling device 17, such as a belt, so that the head shaft 10 is rotated by the polishing head motor 18. The rotation of the head shaft 10 causes the polishing head 1 to rotate in the direction indicated by the arrow.

The optical film-thickness measuring device 40 further includes a light-emitting optical fiber cable 31 arranged to direct the light, emitted by the light source 44, to the surface of the wafer W, and a light-receiving optical fiber cable 32 arranged to receive the reflected light from the wafer W and transmit the reflected light to the spectrometer 47. A distal end of the light-emitting optical fiber cable 31 and a distal end of the light-receiving optical fiber cable 32 are located in the polishing table 3. The distal end of the light-emitting optical fiber cable 31 and the distal end of the light-receiving optical fiber cable 32 constitute the optical sensor head 7 that directs the light to the surface of the wafer W and receives the reflected light from the wafer W. The other end of the light-emitting optical fiber cable 31 is coupled to the light source 44, and the other end of the light-receiving optical fiber cable 32 is coupled to the spectrometer 47. The spectrometer 47 is configured to decompose the reflected light from the wafer W according to wavelength and measure intensities of the reflected light over a predetermined wavelength range.

The polishing table 3 has a first hole 50A and a second hole 50B which open in an upper surface of the polishing table 3. The polishing pad 2 has a through-hole 51 at a position corresponding to the holes 50A and 50B. The holes 50A and 50B are in fluid communication with the through-hole 51, which opens in the polishing surface 2a. The first hole 50A is coupled to a liquid supply line 53. The second hole 50B is coupled to a drain line 54. The optical sensor head 7, composed of the end of the light-emitting optical fiber cable 31 and the end of the light-receiving optical fiber cable 32, is located in the first hole 50A, and is located below the through-hole 51.

The light source 44 may be a pulse light source, such as a xenon flash lamp. The light-emitting optical fiber cable 31 is an optical transmission element for transmitting the light, emitted by the light source 44, to the surface of the wafer W. The distal ends of the light-emitting optical fiber cable 31 and the light-receiving optical fiber cable 32 lie in the first hole 50A, and are located near the surface, to be polished, of the wafer W. The optical sensor head 7, composed of the distal end of the light-emitting optical fiber cable 31 and the distal end of the light-receiving optical fiber cable 32, is arranged so as to face the wafer W held by the polishing head 1, so that the surface (i.e., the surface to be polished) of the wafer W is irradiated with the light each time the polishing table 3 makes one revolution. Only one optical sensor head 7 is provided in the polishing table 3 in this embodiment, while a plurality of optical sensor heads 7 may be provided in the polishing table 3.

During polishing of the wafer W, the optical sensor head 7 directs the light to the wafer W and receives the reflected light from the wafer W. The spectrometer 47 measures the intensity of the reflected light at each of the wavelengths over the predetermined wavelength range and sends the measurement data to the data processor 9. The data processor 9 produces a spectrum of the reflected light showing the light intensities at the respective wavelengths from the measurement data, and further determines the film thickness of the wafer W from the spectrum.

During polishing of the wafer W, pure water as a rinsing liquid is supplied into the first hole 50A through the liquid supply line 53, thus filling a space between the lower surface of the wafer W and the optical sensor head 7. The pure water further flows into the second hole 50B and is discharged through the drain line 54. The slurry is discharged together with the pure water, so that an optical path is ensured.

The liquid supply line 53 and the drain line 54 are coupled to a rotary joint 19 and further extend in the polishing table 3. One end of the liquid supply line 53 is coupled to the first hole 50A. The other end of the liquid supply line 53 is coupled to a pure-water supply source 55 serving as a rinsing-liquid supply source. The pure-water supply source 55 may be a pure-water supply line as a utility supply source provided in a factory where the polishing apparatus is installed. The pure water as the rinsing liquid is supplied to the first hole 50A through the liquid supply line 53, and is further supplied to the through-hole 51 through the first hole 50A.

One end of the drain line 54 is coupled to the second hole 50B. The drain line 54 is coupled to a drain pump 60 for sucking the pure water from the through-hole 51. The pure water that has supplied to the through-hole 51 flows into the second hole 50B and is further discharged to the outside of the polishing apparatus through the drain line 54. The drain pump 60 is electrically coupled to an operation controller 65, and the operation of the drain pump 60 is controlled by the operation controller 65. The operation controller 65 is constituted by at least one computer.

An on-off valve 68 is attached to the liquid supply line 53. This on-off valve 68 is arranged in the polishing table 3 and is located between the rotary joint 19 and the optical sensor head 7. When the on-off valve 68 is open, the pure water is supplied through the liquid supply line 53 into the through-hole 51. On the other hand, when the on-off valve 68 is closed, the pure water is not supplied to the through-hole 51. An orifice for limiting the flow rate of the pure water may be provided upstream or downstream of the on-off valve 68.

The on-off valve 68 may be a solenoid valve or an electric-motor-operated valve. The on-off valve 68 is electrically coupled to the operation controller 65. The operation controller 65 periodically opens and closes the on-off valve 68 in synchronization with the rotation of the polishing table 3 during the polishing of the wafer W. Specifically, the operation controller 65 closes the on-off valve 68 when the wafer W is not located above the through-hole 51, and the operation controller 65 opens the on-off valve 68 when the wafer W is located above the through-hole 51.

A drain valve 70 is attached to the drain line 54. The drain valve 70 may be a solenoid valve or an electric-motor-operated valve. The drain valve 70 is electrically coupled to the operation controller 65, and opening and closing of the drain valve 70 are controlled by the operation controller 65. The on-off valve 68 and the drain valve 70 are valves having no flow-rate controlling function.

A flowmeter 73 is attached to the liquid supply line 53. A flow rate of the pure water flowing through the liquid supply line 53 is measured by the flowmeter 73. The flowmeter 73 is electrically coupled to the operation controller 65, and the measured value of the flow rate is sent to the operation controller 65.

In the present embodiment, the flow rate of the pure water flowing through the liquid supply line 53 is measured by one flowmeter 73, but the present invention is not limited to the present embodiment. When the flow rate of the pure water to be supplied to the through-hole 51 is smaller than an effective measurement range of the flowmeter 73, or when the pure water with a high flow rate is necessary to flow through the rotary joint 19 in order to prevent burn-in of the rotary joint 19, two flowmeters may be provided. Specifically, one of the two flowmeters is arranged upstream of the rotary joint 19, and the other flowmeter is arranged on a branch line branching off from the liquid supply line 53 at a position downstream of the rotary joint 19. The reason for providing the branch line downstream of the rotary joint 19 is to allow a high flow rate of the pure water to flow through the rotary joint 19 so as to prevent burn-in of the rotary joint 19, and to prevent an excessive flow rate of pure water from flowing into the through-hole 51. The flow rate of the pure water supplied to the through-hole 51 corresponds to a difference between a flow rate measured by the flowmeter at the upstream side and a flow rate measured by the flowmeter at the downstream side.

During the polishing of the wafer W, the pure water is supplied from the liquid supply line 53 to the through-hole 51, so that the slurry and the polishing debris are removed from the through-hole 51 through the drain line 54. However, the drain line 54 may be clogged with the slurry and/or the polishing debris. As a result, the pure water cannot be not discharged from the through-hole 51, and overflows onto the polishing pad 2, thus diluting the slurry on the polishing pad 2. The dilution of the slurry can cause a polishing failure of the wafer W. In addition, the slurry and/or the polishing debris remain in the through-hole 51 and may adhere to the optical sensor head 7. As a result, the overall intensity of the reflected light transmitted to the spectrometer 47 is lowered, and accurate measuring of a film thickness is prevented.

Thus, as described below, the polishing apparatus performs a flushing operation of supplying the pure water as a rinsing liquid to the optical sensor head 7 and the drain line 54 so as to clean the optical sensor head 7 and the drain line 54.

Figure 3:
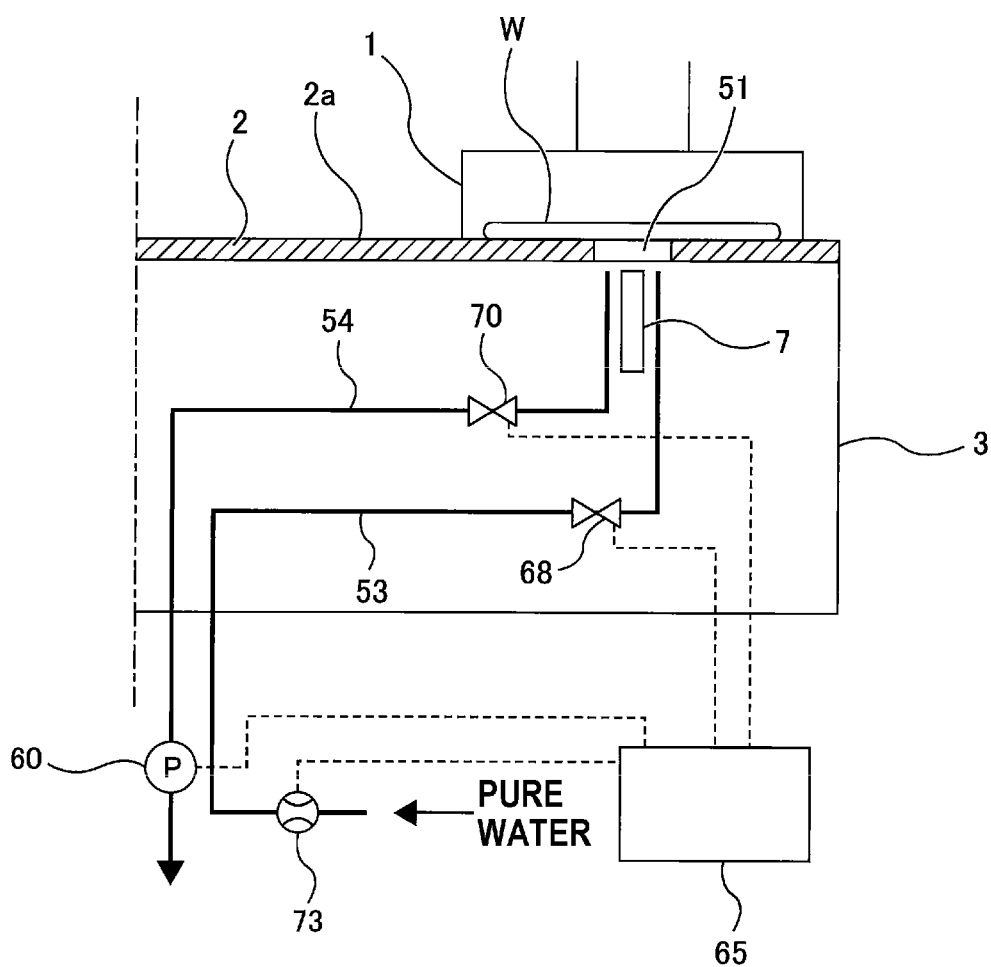
FIG. 3 is a schematic diagram showing an embodiment of a flushing operation for cleaning an optical sensor head and a drain line.

FIG. 3 is a schematic view showing an embodiment of the flushing operation for cleaning the optical sensor head 7 and the drain line 54. In the embodiment shown in FIG. 3, the flushing operation is performed before polishing of the wafer W. In this embodiment, the flushing operation is performed after replacement of a polishing pad that has been used for polishing of wafers with a new polishing pad and before a wafer is first polished. During the flushing operation, the polishing table 3 and the polishing pad 2 are not rotated and stay in a stationary state.

The polishing head 1 presses the wafer W against the polishing pad 2 to cover the through-hole 51 of the polishing pad 2 with the wafer W. In this embodiment, the wafer W, which is a product wafer to be polished, is used as a structural element for covering the through-hole 51, but a dummy wafer may be used instead of the wafer W. The dummy wafer is, for example, a blanket wafer with a non-patterned film formed thereon, or a silicon wafer having no film. Further, instead of the wafer W, another structural element, such as a block or a plate, may be used to cover the through-hole 51. In one embodiment, the polishing head 1 that does not hold a wafer may be used as a structural element, and the through-hole 51 may be covered with a lower surface of the polishing head 1.

With the wafer W covering the through-hole 51, the operation controller 65 instructs the drain pump 60 to operate and opens the on-off valve 68 and the drain valve 70. The on-off valve 68 and the drain valve 70 depicted in white color in the drawing indicate an open state. The pure water as the rinsing liquid is supplied to the through-hole 51 of the polishing pad 2 through the liquid supply line 53. The pure water comes into contact with the optical sensor head 7 after colliding with the wafer W, and removes the slurry and the polishing debris from the optical sensor head 7. Further, the drain pump 60 sucks the pure water in the through-hole 51 through the drain line 54. The pure water flows through the drain line 54 and cleans the inside of the drain line 54.

As described above, according to the present embodiment, the pure water as the rinsing liquid is supplied to the through-hole 51 when polishing of a wafer using the slurry is not performed, and the pure water flows through the drain line 54. As a result, the optical sensor head 7 and the drain line 54 are cleaned with the pure water, and the optical film-thickness measuring system 40 can maintain its proper operations.

During the flushing operation, the operation controller 65 monitors whether a measured value of the flow rate sent from the flowmeter 73, i.e., the flow rate of the pure water flowing through the liquid supply line 53, is equal to or higher than a predetermined threshold value. If the flow rate of the pure water is less than the threshold value, the drain line 54 may be clogged with the slurry and/or the polishing debris. Therefore, when the flow rate of the pure water flowing through the liquid supply line 53 during the flushing operation is less than the threshold value, the operation controller 65 generates an alarm signal and transmits the alarm signal to an external display device or the like. According to this embodiment, the operation controller 65 can detect the clogging of the drain line 54 based on the flow rate of the pure water measured during the flushing operation.

Figure 4:
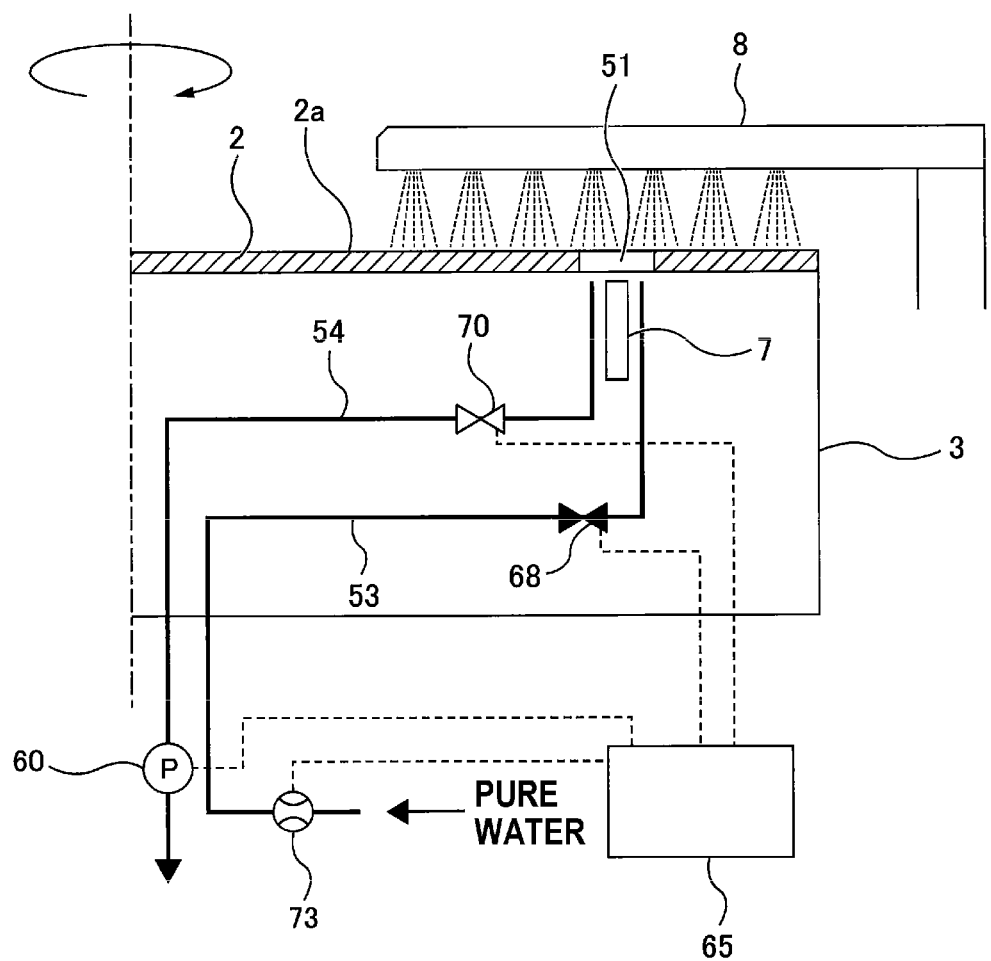
FIG. 4 is a schematic diagram showing another embodiment of the flushing operation for cleaning the optical sensor head and the drain line.

FIG. 4 is a schematic diagram for explaining another embodiment of the flushing operation. Operations of this embodiment, which will not be particularly described, are the same as the operations of the embodiment shown in FIG. 3, and their repetitive descriptions will be omitted. In this embodiment, the flushing operation is performed while the polishing table 3 is rotating after polishing of a wafer is performed. More specifically, the flushing operation is performed during cleaning of the polishing surface 2a of the polishing pad 2 which is performed after polishing of a wafer.

After a wafer is polished, the atomizer 8 (which is a polishing-pad cleaning nozzle) supplies the fluid mixture of the pure water and the gas to the polishing surface 2a of the polishing pad 2 to clean the polishing surface 2a, while the polishing table 3 and the polishing pad 2 are being rotated. During cleaning of the polishing pad 2 by the atomizer 8, the on-off valve 68 is kept closed and the drain valve 70 is kept open. The on-off valve 68 depicted in black color in the drawing indicates a closed state, and the drain valve 70 depicted in white color in the drawing indicates an open state.

In one embodiment, during cleaning of the polishing pad 2 by the atomizer 8, the operation controller 65 may periodically open and close the drain valve 70 in synchronization with the rotation of the polishing table 3. More specifically, the operation controller 65 may open the drain valve 70 when the through-hole 51 of the polishing pad 2 is located under the atomizer 8 as the polishing table 3 rotates, and the operation controller 65 may close the drain valve 70 when the through-hole 51 of the polishing pad 2 is moved away from the atomizer 8.

The atomizer 8 supplies the fluid mixture of the pure water and the gas to the through-hole 51 from above the polishing pad 2. The pure water constituting the fluid mixture comes into contact with the optical sensor head 7 and removes the slurry and the polishing debris from the optical sensor head 7. In addition, the drain pump 60 sucks the pure water in the through-hole 51 through the drain line 54. The pure water flows through the drain line 54 and cleans the inside of the drain line 54. In this embodiment, the detection of clogging of the drain line 54 based on the flow rate of the pure water flowing through the liquid supply line 53 is not performed.

Figure 5:
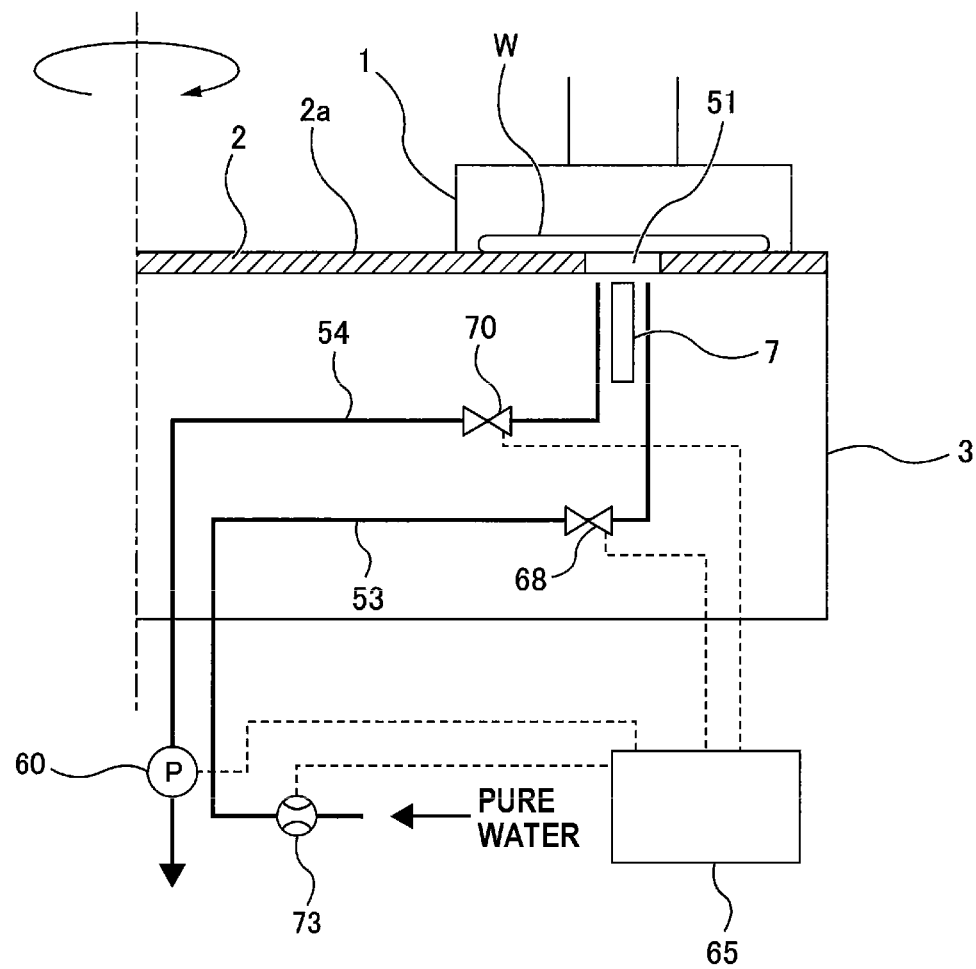
FIG. 5 is a schematic diagram showing still another embodiment of the flushing operation for cleaning the optical sensor head and the drain line.
Figure 5:
Figure 5:
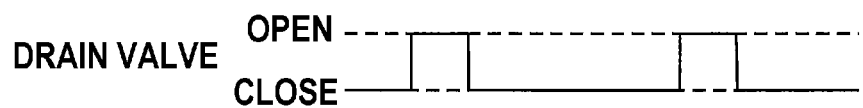

FIG. 5 is a schematic diagram for explaining another embodiment of the flushing operation. Operations of this embodiment, which will not be particularly described, are the same as the operations of the embodiment shown in FIG. 3, and their repetitive descriptions will be omitted. In this embodiment, the flushing operation is performed while the polishing table 3 is rotating after polishing of the wafer W. More specifically, the flushing operation is performed during a water polishing process which is performed after the wafer W is polished.

The water polishing process is performed after the wafer W is polished with use of the slurry. More specifically, the water polishing process is an operation of placing the wafer W in sliding contact with the polishing pad 2 while supplying the pure water from the liquid supply nozzle 5 onto the polishing pad 2 instead of the slurry. During the water polishing process, the wafer W is pressed against the polishing pad 2 with a lower pressing force than that during polishing using the slurry. Unlike the slurry, the pure water does not have an etching action and does not contain abrasive grains, so that polishing of the wafer W does not substantially proceed during the water polishing process. The purpose of performing the water polishing process after polishing of the wafer W using the slurry is to remove the slurry from the polished surface of the wafer W.

As the polishing table 3 rotates, the through-hole 51 of the polishing pad 2 is intermittently covered with the wafer W. The operation controller 65 periodically opens and closes the on-off valve 68 and the drain valve 70 in synchronization with the rotation of the polishing table 3. More specifically, the operation controller 65 opens the on-off valve 68 and the drain valve 70 when the through-hole 51 is covered with the wafer W. The on-off valve 68 and the drain valve 70 depicted in white color in the drawing indicate an open state. In one embodiment, the drain valve 70 may be kept open during the water polishing process.

When the through-hole 51 is covered with the wafer W, the pure water as the rinsing liquid is supplied into the through-hole 51 of the polishing pad 2 through the liquid supply line 53. The pure water comes into contact with the optical sensor head 7 after colliding with the wafer W, and removes the slurry and the polishing debris from the optical sensor head 7. In addition, the drain pump 60 sucks the pure water in the through-hole 51 through the drain line 54. The pure water flows through the drain line 54 and cleans the inside of the drain line 54. In this embodiment, the detection of clogging of the drain line 54 based on the flow rate of the pure water flowing through the liquid supply line 53 may be performed.

Figure 6:
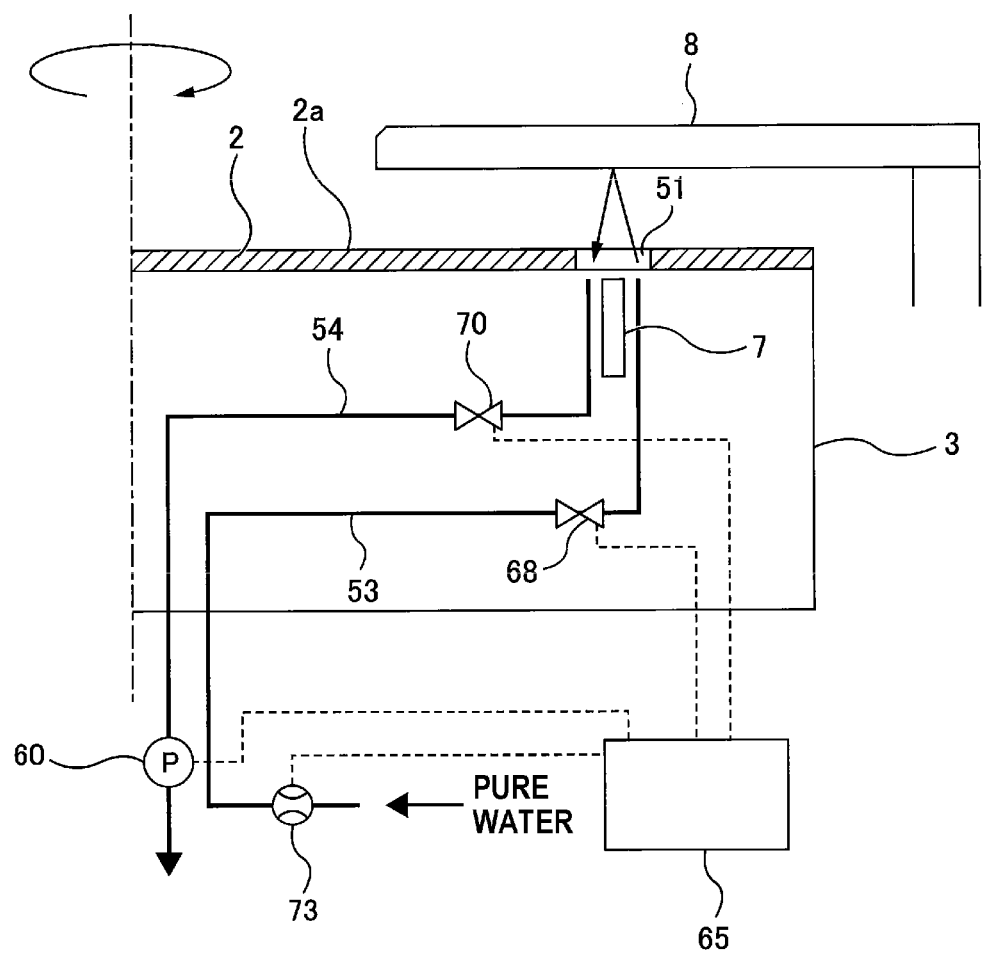
FIG. 6 is a schematic diagram showing still another embodiment of the flushing operation for cleaning the optical sensor head and the drain line.
Figure 6:
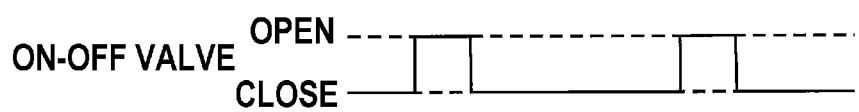
Figure 6:
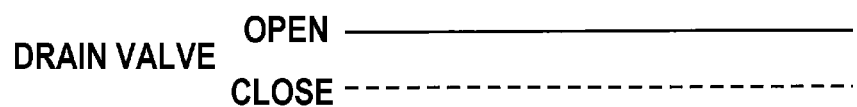

FIG. 6 is a schematic diagram for explaining another embodiment of the flushing operation. Operations of this embodiment, which will not be particularly described, are the same as the operations of the embodiment shown in FIG. 3, and their repetitive descriptions will be omitted. In this embodiment, the flushing operation is performed while the polishing table 3 is rotating after polishing of a wafer. More specifically, the flushing operation is performed after cleaning of the polishing surface 2*a* of the polishing pad 2 which is performed after polishing of a wafer.

After a wafer is polished, the atomizer 8 (which is a polishing-pad cleaning nozzle) supplies the fluid mixture of the pure water and the gas to the polishing surface 2*a* of the polishing pad 2 to clean the polishing surface 2*a*, while the polishing table 3 and the polishing pad 2 are being rotated. Thereafter, the supply of the fluid mixture to the polishing pad 2 is stopped, while the polishing table 3 and the polishing pad 2 are kept rotating.

The operation controller 65 periodically opens and closes the on-off valve 68 in synchronization with the rotation of the polishing table 3. More specifically, the operation controller 65 opens the on-off valve 68 when the through-hole 51 of the polishing pad 2 is located under the atomizer 8 as the polishing table 3 rotates, and the operation controller 65 closes the on-off valve 68 when the through-hole 51 of the polishing pad 2 is moved away from the atomizer 8. During the flushing operation, the drain valve 70 is kept open.

In one embodiment, the operation controller 65 may periodically open and close the on-off valve 68 and the drain valve 70 in synchronization with the rotation of the polishing table 3. More specifically, the operation controller 65 may open the on-off valve 68 and the drain valve 70 when the through-hole 51 of the polishing pad 2 is located under the atomizer 8 as the polishing table 3 rotates, and the operation controller 65 may close the on-off valve 68 and the drain valve 70 when the through-hole 51 of the polishing pad 2 is moved away from the atomizer 8.

When the on-off valve 68 is open, the pure water is emitted from the liquid supply line 53 toward a lower surface of the atomizer 8. The pure water collides with the lower surface of the atomizer 8 and then falls into the through-hole 51. The pure water comes into contact with the optical sensor head 7 and removes the slurry and the polishing debris from the optical sensor head 7. In addition, the drain pump 60 sucks the pure water in the through-hole 51 through the drain line 54. The pure water flows through the drain line 54 and cleans the inside of the drain line 54. In this embodiment, the detection of clogging of the drain line 54 based on the flow rate of the pure water flowing through the liquid supply line 53 is not performed.

Figure 7:
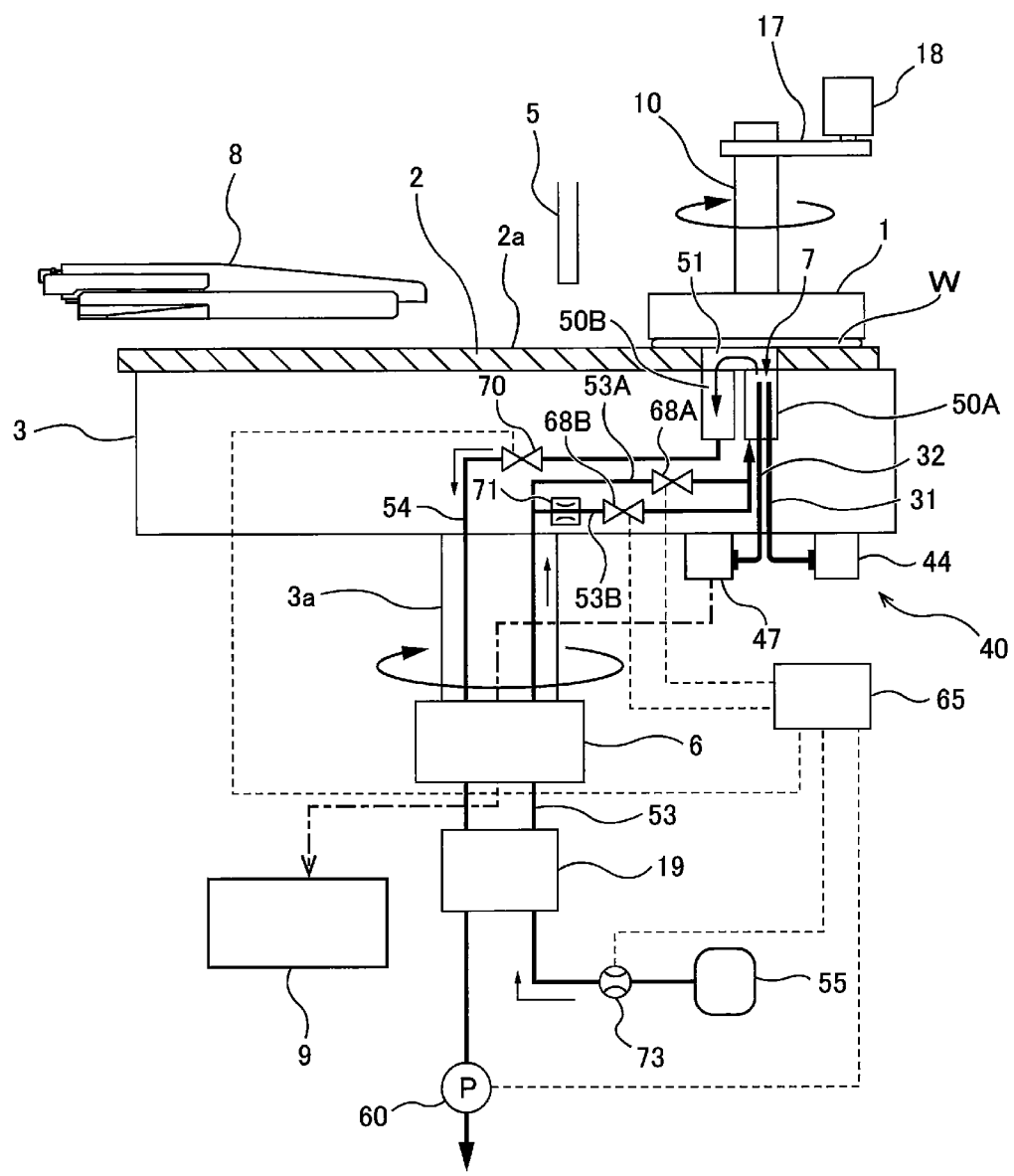
FIG. 7 is a cross-sectional view showing another embodiment of detailed configurations of a polishing apparatus.

FIG. 7 is a cross-sectional view showing another embodiment of the polishing apparatus. Configurations and operations of the present embodiment, which will not be particularly described, are the same as those of the embodiment shown in FIG. 2, and their repetitive descriptions will be omitted. A part of the liquid supply line 53 is composed of a first parallel line 53A and a second parallel line 53B. These parallel lines 53A and 53B are arranged in the polishing table 3 and are located between the rotary joint 19 and the optical sensor head 7. Ends of the first parallel line 53A and the second parallel line 53B are coupled to each other, and other ends of the first parallel line 53A and the second parallel line 53B are also coupled to each other. Therefore, the pure water flowing through the liquid supply line 53 once branches into the first parallel line 53A and the second parallel line 53B, and then rejoins. In one embodiment, ends of the first parallel line 53A and the second parallel line 53B may be coupled to each other, while other ends of the first parallel line 53A and the second parallel line 53B may not be coupled to each other.

A first on-off valve 68A is attached to the first parallel line 53A. When the first on-off valve 68A is open, the pure water is supplied to the through-hole 51 through the first parallel line 53A. When the first on-off valve 68A is closed, the pure water cannot flow through the first parallel line 53A.

A second on-off valve 68B and an orifice 71 are attached to the second parallel line 53B. When the second on-off valve 68B is open, the pure water is supplied to the through-hole 51 through the second parallel line 53B. When the second on-off valve 68B is closed, the pure water cannot flow through the second parallel line 53B. The orifice 71 is provided so as to limit the flow rate of the pure water flowing through the second parallel line 53B. More specifically, the flow rate of the pure water that can pass through the orifice 71 is lower than the flow rate of the pure water that flows through the first parallel line 53A. In one embodiment, an orifice that allows passage of the pure water at a flow rate higher than that of the orifice 71 may be attached to the first parallel line 53A.

The first on-off valve 68A and the second on-off valve 68B may be solenoid valves or electric-motor-operated valves. The first on-off valve 68A and the second on-off valve 68B are electrically coupled to the operation controller 65. The operation controller 65 periodically opens and closes the first on-off valve 68A in synchronization with the rotation of the polishing table 3 during the polishing of the wafer W. Specifically, the operation controller 65 closes the first on-off valve 68A when the wafer W is not located above the through-hole 51, and the operation controller 65 opens the first on-off valve 68A when the wafer W is located above the through-hole 51. The second on-off valve 68B is kept open during the polishing of the wafer W. In one embodiment, the operation controller 65 may close the first on-off valve 68A and open the second on-off valve 68B when the wafer W is not located above the through-hole 51, and the operation controller 65 may open the first on-off valve 68A and close the second on-off valve 68B when the wafer W is located above the through-hole 51.

Figure 8:
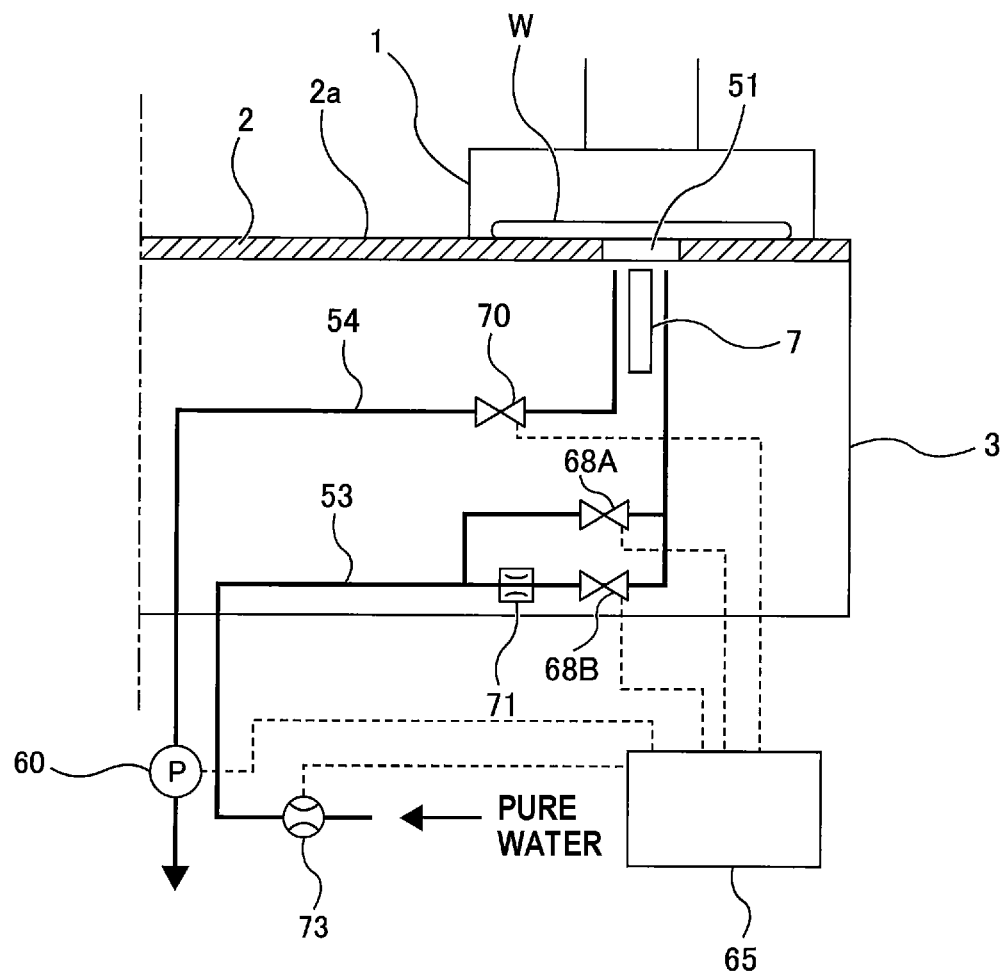
FIG. 8 is a schematic diagram showing an embodiment of a flushing operation for cleaning an optical sensor head and a drain line shown in FIG. 7.

FIG. 8 is a schematic view showing an embodiment of a flushing operation for cleaning the optical sensor head 7 and the drain line 54 shown in FIG. 7. In the embodiment shown in FIG. 8, the flushing operation is performed before polishing of the wafer W. More specifically, the flushing operation is performed after replacement of a polishing pad that has been used for polishing of wafers with a new polishing pad and before a wafer is first polished. During the flushing operation, the polishing table 3 and the polishing pad 2 are not rotated and stay in a stationary state.

The polishing head 1 presses the wafer W against the polishing pad 2 to cover the through-hole 51 of the polishing pad 2 with the wafer W. In this embodiment, the wafer W, which is a product wafer to be polished, is used as a structural element for covering the through-hole 51, but the dummy wafer may be used instead of the wafer W. Further, instead of the wafer W, another structural element, such as a block or a plate, may be used to cover the through-hole 51. In one embodiment, the polishing head 1 that does not hold a wafer may be used as a structural element, and the through-hole 51 may be covered with a lower surface of the polishing head 1.

With the wafer W covering the through-hole 51, the operation controller 65 instructs the drain pump 60 to operate, and opens the first on-off valve 68A, the second on-off valve 68B, and the drain valve 70. In one embodiment, the second on-off valve 68B may remain closed. The pure water as the rinsing liquid is supplied through the liquid supply line 53 into the through-hole 51 of the polishing pad 2. The pure water comes into contact with the optical sensor head 7 after colliding with the wafer W, and removes the slurry and the polishing debris from the optical sensor head 7. Further, the drain pump 60 sucks the pure water in the through-hole 51 through the drain line 54. The pure water flows through the drain line 54 and cleans the inside of the drain line 54.

As described above, according to the present embodiment, the pure water as the rinsing liquid is supplied to the through-hole 51 when polishing of a wafer using the slurry is not performed, and the pure water flows through the drain line 54. As a result, the optical sensor head 7 and the drain line 54 are cleaned with the pure water, and the optical film-thickness measuring system 40 can maintain its proper operations.

When the flow rate of the pure water flowing through the liquid supply line 53 during the flushing operation is smaller than a threshold value, the operation controller 65 generates an alarm signal and transmits the alarm signal to an external display device or the like.

Figure 9:
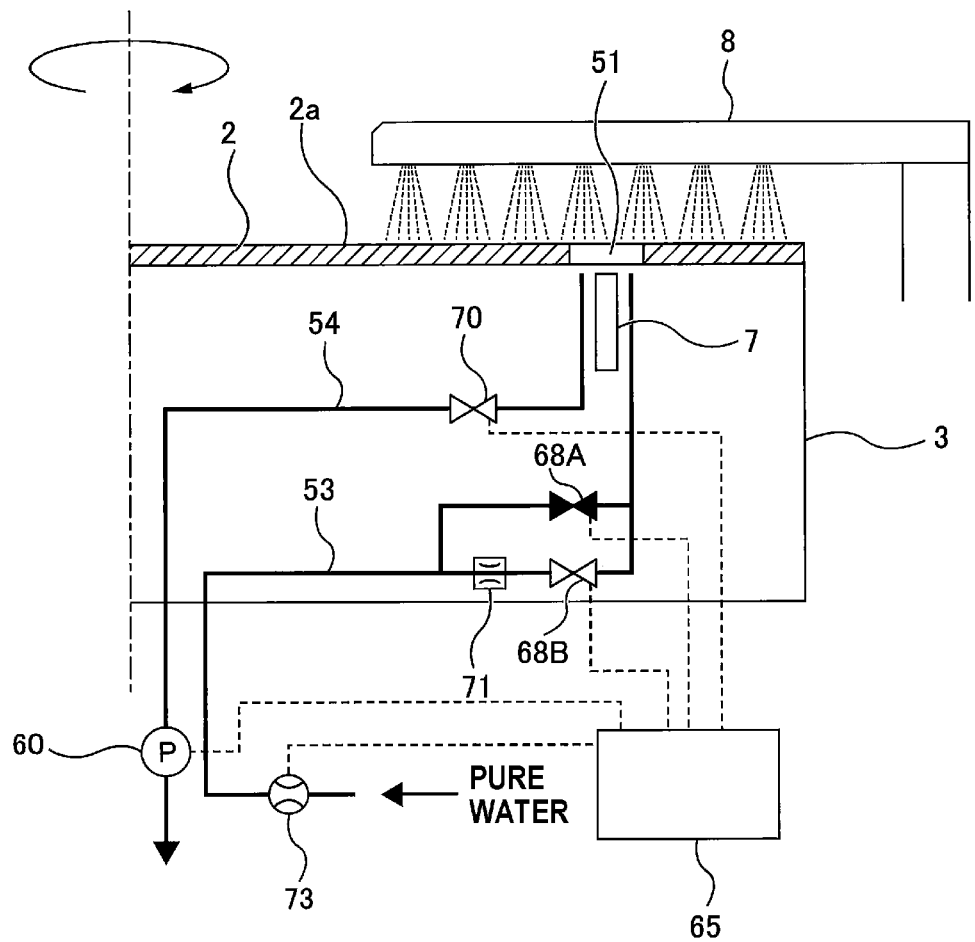
FIG. 9 is a schematic diagram showing another embodiment of the flushing operation for cleaning the optical sensor head and the drain line.

FIG. 9 is a schematic diagram for explaining another embodiment of the flushing operation. Operations of this embodiment, which will not be particularly described, are the same as the operations of the embodiment shown in FIG. 8, and their repetitive descriptions will be omitted. In this embodiment, the flushing operation is performed while the polishing table 3 is rotating after polishing of a wafer. More specifically, the flushing operation is performed during cleaning of the polishing surface 2a of the polishing pad 2 which is performed after polishing of a wafer.

After a wafer is polished, the atomizer 8 (which is a polishing-pad cleaning nozzle) supplies the fluid mixture of the pure water and the gas to the polishing surface 2a of the polishing pad 2 to clean the polishing surface 2a, while the polishing table 3 and the polishing pad 2 are being rotated. During cleaning of the polishing pad 2 by the atomizer 8, the first on-off valve 68A is kept closed, while the second on-off valve 68B and the drain valve 70 are kept open. The reason for keeping the second on-off valve 68B open is to prevent the slurry and the polishing debris from flowing into the pure water supply side.

In one embodiment, both the first on-off valve 68A and the second on-off valve 68B may be kept closed during cleaning of the polishing pad 2 by the atomizer 8. Further, in one embodiment, the operation controller 65 may periodically open and close the drain valve 70 in synchronization with the rotation of the polishing table 3. More specifically, the operation controller 65 may open the drain valve 70 when the through-hole 51 of the polishing pad 2 is located under the atomizer 8 as the polishing table 3 rotates, and the operation controller 65 may close the drain valve 70 when the through-hole 51 of the polishing pad 2 is moved away from the atomizer 8.

The atomizer 8 supplies the fluid mixture of the pure water and the gas to the through-hole 51 from above the polishing pad 2. The pure water constituting the fluid mixture comes into contact with the optical sensor head 7 and removes the slurry and the polishing debris from the optical sensor head 7. In addition, the drain pump 60 sucks the pure water in the through-hole 51 through the drain line 54. The pure water flows through the drain line 54 and cleans the inside of the drain line 54. In this embodiment, the detection of clogging of the drain line 54 based on the flow rate of the pure water flowing through the liquid supply line 53 is not performed.

Figure 10:
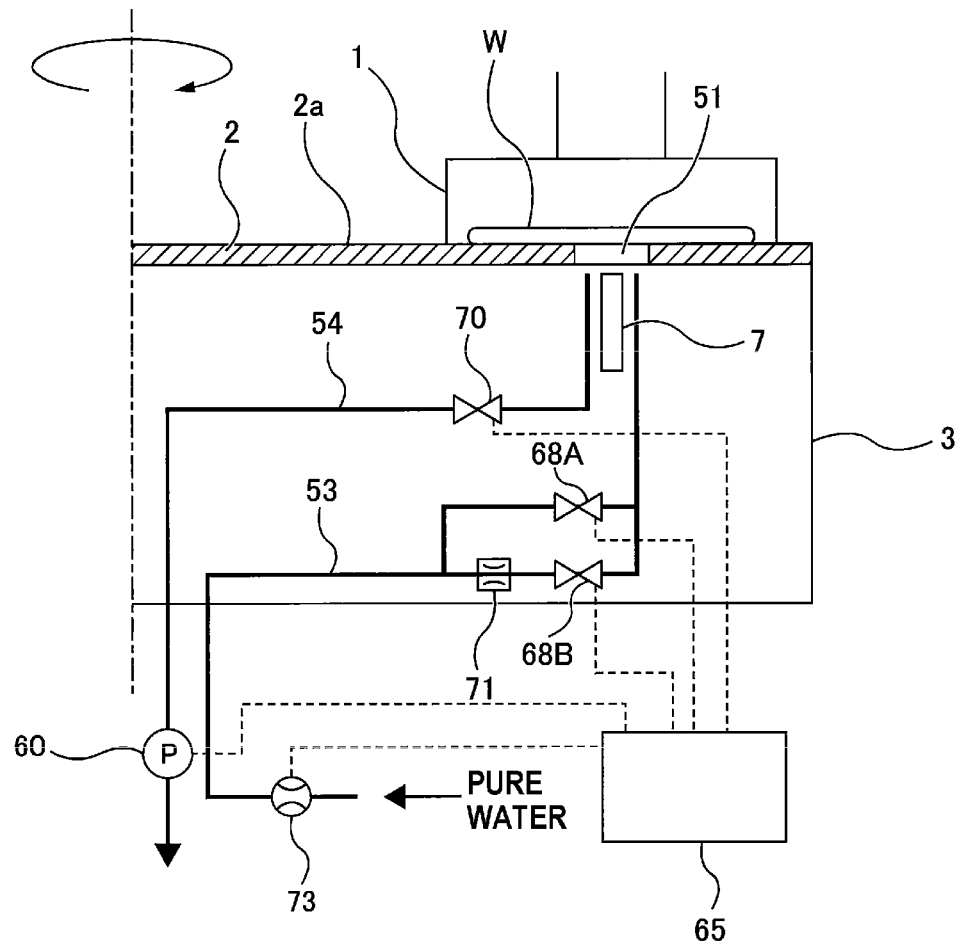
FIG. 10 is a schematic diagram showing still another embodiment of the flushing operation for cleaning the optical sensor head and the drain line.

FIG. 10 is a schematic diagram for explaining another embodiment of the flushing operation. Operations of this embodiment, which will not be particularly described, are the same as the operations of the embodiment shown in FIG. 8, and their repetitive descriptions will be omitted. In this embodiment, the flushing operation is performed while the polishing table 3 is rotating after polishing of the wafer W.

More specifically, the flushing operation is performed during the water polishing process which is performed after the wafer W is polished.

As the polishing table 3 rotates, the through-hole 51 of the polishing pad 2 is intermittently covered with the wafer W. The operation controller 65 periodically opens and closes the first on-off valve 68A and the drain valve 70 in synchronization with the rotation of the polishing table 3. More specifically, the operation controller 65 opens the first on-off valve 68A and the drain valve 70 when the through-hole 51 is covered with the wafer W. The second on-off valve 68B is kept open during the water polishing process. The reason for keeping the second on-off valve 68B open is to prevent the slurry and the polishing debris from flowing into the pure water supply side. In one embodiment, the drain valve 70 may be kept open during the water polishing process.

When the through-hole 51 is covered with the wafer W, the pure water as the rinsing liquid is supplied through the liquid supply line 53 into the through-hole 51 of the polishing pad 2. The pure water comes into contact with the optical sensor head 7 after colliding with the wafer W, and removes the slurry and the polishing debris from the optical sensor head 7. In addition, the drain pump 60 sucks the pure water in the through-hole 51 through the drain line 54. The pure water flows through the drain line 54 and cleans the inside of the drain line 54. In this embodiment, the detection of clogging of the drain line 54 based on the flow rate of the pure water flowing through the liquid supply line 53 may be performed.

Figure 11:
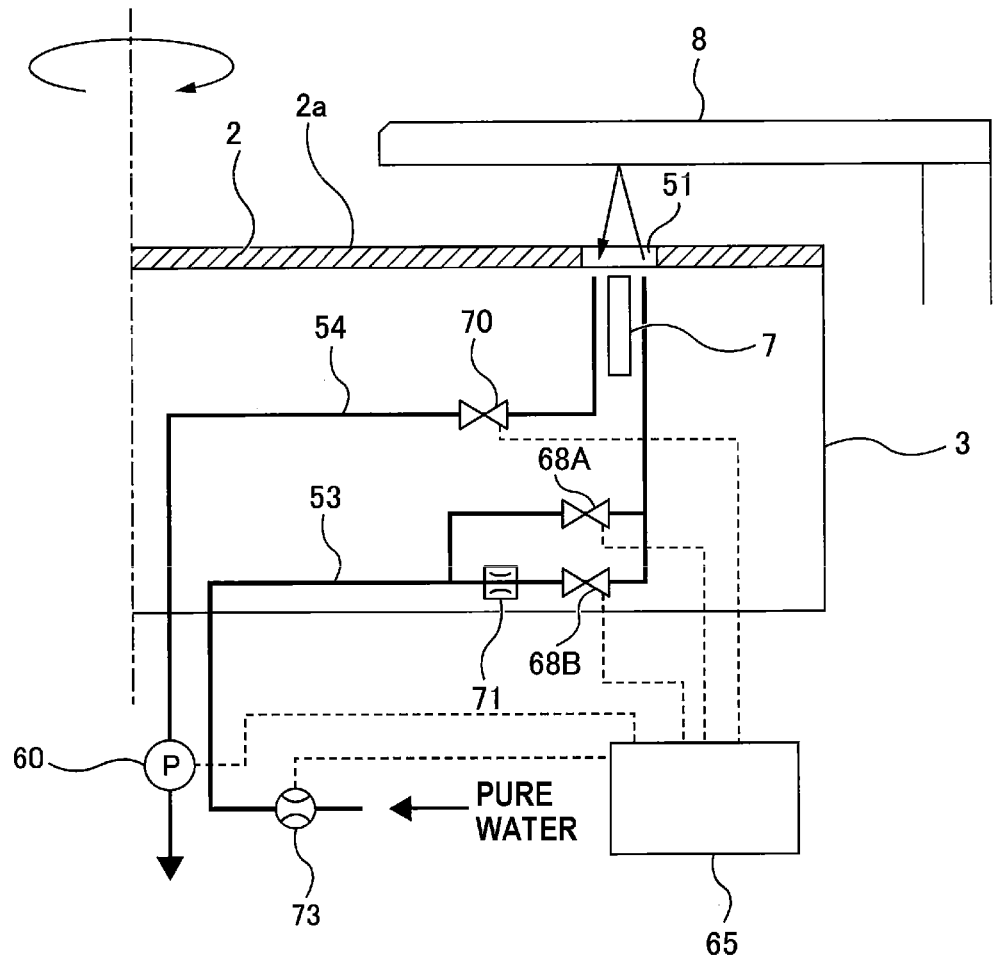
FIG. 11 is a schematic diagram showing still another embodiment of the flushing operation for cleaning the optical sensor head and the drain line.
Figure 12:
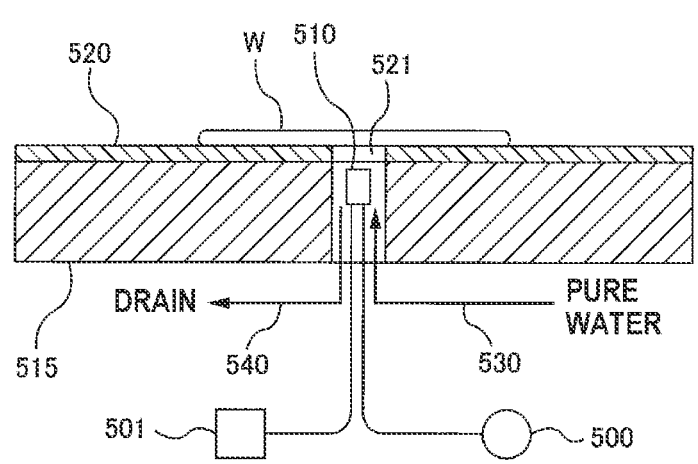
FIG. 12 is a schematic diagram of an optical film-thickness measuring system.

FIG. 11 is a schematic diagram for explaining another embodiment of the flushing operation. Operations of this embodiment, which will not be particularly described, are the same as the operations of the embodiment shown in FIG. 8, and their repetitive descriptions will be omitted. In this embodiment, the flushing operation is performed while the polishing table 3 is rotating after polishing of a wafer. More specifically, the flushing operation is performed after cleaning of the polishing surface 2a of the polishing pad 2 which is performed after polishing of a wafer.

After a wafer is polished, the atomizer 8 (which is a polishing-pad cleaning nozzle) supplies the fluid mixture of the pure water and the gas to the polishing surface 2a of the polishing pad 2 to clean the polishing surface 2a, while the polishing table 3 and the polishing pad 2 are being rotated. Thereafter, the supply of the fluid mixture to the polishing pad 2 is stopped while the polishing table 3 and the polishing pad 2 are kept rotating.

The operation controller 65 periodically opens and closes the first on-off valve 68A in synchronization with the rotation of the polishing table 3. More specifically, the operation controller 65 opens the first on-off valve 68A when the through-hole 51 of the polishing pad 2 is located under the atomizer 8 as the polishing table 3 rotates, and the operation controller 65 closes the first on-off valve 68A when the through-hole 51 of the polishing pad 2 is moved away from the atomizer 8. The second on-off valve 68B and the drain valve 70 are kept open during the flushing operation.

In one embodiment, the operation controller 65 may periodically open and close the first on-off valve 68A and the drain valve 70 in synchronization with the rotation of the polishing table 3. More specifically, the operation controller 65 may open the first on-off valve 68A and the drain valve 70 when the through-hole 51 of the polishing pad 2 is located under the atomizer 8 as the polishing table 3 rotates, and the operation controller 65 may close the first on-off valve 68A and the drain valve 70 when the through-hole 51 of the polishing pad 2 is moved away from the atomizer 8.

When the first on-off valve 68A is open, the pure water is emitted from the liquid supply line 53 toward the lower surface of the atomizer 8. The pure water collides with the lower surface of the atomizer 8 and then falls into the through-hole 51. The pure water comes into contact with the optical sensor head 7 and removes the slurry and the polishing debris from the optical sensor head 7. In addition, the drain pump 60 sucks the pure water in the through-hole 51 through the drain line 54. The pure water flows through the drain line 54 and cleans the inside of the drain line 54. In this embodiment, the detection of clogging of the drain line 54 based on the flow rate of the pure water flowing through the liquid supply line 53 is not performed.

Each embodiment shown in FIGS. 3 to 6 and FIGS. 8 to 11 is an example in which the flushing operation is performed when an operation other than the polishing operation using the slurry is performed, or when a series of polishing operations using the slurry is stopped. The timing of performing the flushing operation is not particularly limited as long as the polishing operation using the slurry is not performed.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

INDUSTRIAL APPLICABILITY

The present invention is applicable to a method of cleaning an optical film-thickness measuring system used for measuring a film thickness of a substrate, such as a wafer, while polishing the substrate.

REFERENCE SIGNS LIST 1 polishing head
2 polishing pad
3 polishing table
5 liquid supply nozzle
6 table motor
7 optical sensor head
8 atomizer (polishing-pad cleaning nozzle)
9 data processor
10 head shaft
12 gas supply line
13 pure-water supply line
17 coupling device
18 polishing-head motor
19 rotary joint
31 light-emitting optical fiber cable
32 light-receiving optical fiber cable
40 optical film-thickness measuring system
44 light source
47 spectrometer
50A first hole
50B second hole
51 through-hole
53 liquid supply line
53A first parallel line
53B second parallel line
54 drain line
55 pure-water supply source 60 drain pump
65 operation controller
68 on-off valve
68A first on-off valve
68B second on-off valve
70 drain valve
73 flowmeter

The invention claimed is:

1. A method comprising:
cleaning an optical sensor head by supplying a rinsing liquid through a liquid-supply line into a through-hole formed in a polishing pad on a polishing table before or after polishing of a substrate with slurry on the polishing pad, the optical sensor head being located below the through-hole;
discharging the rinsing liquid from the through-hole through a drain line;
measuring a flow rate of the rinsing liquid flowing through the liquid-supply line; and
generating an alarm signal when a measured value of the flow rate is less than a threshold value due to an existence of the slurry or polishing debris in the drain line.

2. The method according to claim 1, wherein the rinsing liquid is supplied into the through-hole while the through-hole is covered with a structural element.

3. The method according to claim 1, wherein the rinsing liquid is supplied into the through-hole through the liquid-supply line extending in the polishing table.

4. The method according to claim 1, wherein the rinsing liquid is supplied into the through-hole from a polishing-pad cleaning nozzle arranged above the polishing pad.

5. The method according to claim 1, wherein supplying of the rinsing liquid into the through-hole comprises emitting the rinsing liquid toward a lower surface of a polishing-pad cleaning nozzle arranged above the polishing pad, and supplying the rinsing liquid that has fallen from the lower surface of the polishing-pad cleaning nozzle into the through-hole.

6. The method according to claim 1, wherein the drain line is coupled to a drain pump configured to suck the rinsing liquid from the through-hole.

7. The method according to claim 1, wherein the flow rate of the rinsing liquid is measured during supplying of the rinsing liquid through the liquid-supply line into the through-hole and discharging of the rinsing liquid from the through-hole through the drain line.

8. The method according to claim 1, wherein the alarm signal is indicative of clogging of the drain line.

9. The method according to claim 2, wherein the rinsing liquid is supplied into the through-hole while the through-hole is covered with the structural element and the polishing table is stationary.

10. The method according to claim 2, wherein the rinsing liquid is supplied into the through-hole while the through-hole is intermittently covered with the structural element and the polishing table is rotating.

11. The method according to claim 9, wherein the structural element is a wafer.

* * * * *